US006999368B2

(12) United States Patent
Fujimoto et al.

(10) Patent No.: US 6,999,368 B2
(45) Date of Patent: Feb. 14, 2006

(54) SEMICONDUCTOR MEMORY DEVICE AND SEMICONDUCTOR INTEGRATED CIRCUIT DEVICE

(75) Inventors: Tomonori Fujimoto, Osaka (JP); Kiyoto Ohta, Osaka (JP); Hirohito Kikukawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/847,392

(22) Filed: May 18, 2004

(65) Prior Publication Data
US 2004/0240299 A1    Dec. 2, 2004

(30) Foreign Application Priority Data
May 27, 2003    (JP) .............................. 2003-149323

(51) Int. Cl.
*G11C 7/00*    (2006.01)

(52) U.S. Cl. ..................................... 365/222; 365/191

(58) Field of Classification Search ................ 365/222, 365/191
See application file for complete search history.

(56) References Cited

U.S. PATENT DOCUMENTS

| 4,984,208 A | | 1/1991 | Sawada et al. |
| 5,031,147 A | * | 7/1991 | Maruyama et al. ..... 365/189.07 |
| 6,404,687 B2 | * | 6/2002 | Yamasaki ..................... 365/222 |
| 6,751,144 B2 | * | 6/2004 | Takahashi et al. .......... 365/222 |
| 2002/0159318 A1 | | 10/2002 | Arimoto et al. |

FOREIGN PATENT DOCUMENTS

| JP | 61-71494 | 4/1986 |
| JP | 11-339468 | 12/1999 |
| JP | P2001-210074 A | 8/2001 |
| JP | P2002-175691 A | 6/2002 |

* cited by examiner

*Primary Examiner*—Michael Tran
(74) *Attorney, Agent, or Firm*—McDermott Will & Emery LLP

(57) ABSTRACT

A row control circuit of a semiconductor memory device includes an oscillator as a clock oscillator for generating an internal clock, a D flipflop as a refresh request signal RFRQ generation circuit for generating a refresh request signal RFRQ synchronously with the internal clock, and a delay circuit, a NAND gate, an AND gate, a D flipflop, a delay circuit, an AND gate and an OR gate as refresh circuits. By using a refresh request signal RFRQ and an active signal ACT, internal refresh is performed internally in a DRAM separately from an external refresh command.

23 Claims, 8 Drawing Sheets

SEMICONDUCTOR MEMORY DEVICE AND SEMICONDUCTOR INTEGRATED CIRCUIT DEVICE

BACKGROUND OF THE INVENTION

The present invention relates to a semiconductor memory device and a semiconductor integrated circuit device which include a memory cell requiring refresh for holding data.

To hold data of a memory cell, DRAMs require a refresh operation. A DRAM disclosed in Reference 1 (Japanese Laid-Open Publication No. 11-339468 (FIG. 3) is capable of performing an auto-refresh operation by a refresh request signal from the outside and a self-refresh operation by setting the DRAM to be a self-refresh mode for performing refresh using an internal timer.

In an auto-refresh operation, in an interval between read/write operations, a refresh request signal has to be generated outside of the DRAM and supplied to the DRMA so that a refresh operation is performed for a predetermined number of times in every given period.

In a self-refresh operation, a refresh operation of the DRAM is started based on the internal timer. Therefore, it is not necessary to externally generate a timing signal for each individual refresh operation. However, a read/write access from the outside is not allowed in a period in which the DRAM is in a self-refresh mode.

Moreover, in Reference 2 (Japanese Laid-Open Publication No. 2001-210074 (FIG. 3)), disclosed is a technique for detecting that there is no request for a read/write operation from the outside and internally generating a refresh control signal in the DRAM to automatically perform refresh. Furthermore, a technique for performing, if the internal refresh operation has been performed for necessary times in a predetermined period, a control so that no more refresh operation is performed, in order to reduce consumption power is also disclosed.

In Reference 3 (Japanese Laid-Open Publication No. 2002-175691 (FIG. 4), disclosed is a DRAM which performs, when a read/write operation is commanded from the outside, a refresh operation in a read/write cycle of the commanded read/write operation before an actual read/write processing is performed. With this DRAM, it is not necessary to externally generate a refresh request signal and stop a read/write operation to insert a refresh operation. Therefore, a data transfer rate can be increased.

SUMMARY OF THE INVENTION

In the DRAM disclosed in Reference 1, to hold data of a memory cell while a read/write operation is performed, a refresh request has to be externally made. Refresh request generation processing has to be inserted in an interval between read/write operations. Moreover, a refresh operation has to be performed for a predetermined number of times in every given period. This makes memory control from the outside complicated.

On the other hand, in the DRAM disclosed in Reference 2, if a cycle in which no read/write operation request (i.e., NOP cycle) appears in a sufficient frequency between read/write operations, it becomes not necessary to externally generate a refresh request, a refresh operation is internally performed, and data of a memory cell is held. However, if read/write operation requests are consecutively generated and the number of NOP cycles is reduced, and the predetermined number of times of refresh operations is not achieved, data can not be held.

In the DRAM of Reference 3, even if a refresh operation is not externally performed, data of a memory cell can be held by a refresh operation performed before a read/write operation. Moreover, even in the case where read/write access requests are consecutively generated without any NOP present therebetween, a refresh operation is reliably performed. However, if a read/write operation is frequently performed, a refresh operation is also performed frequently, resulting in increase in power consumption.

It is therefore an object of the present invention to provide a semiconductor memory device which does not require a complicated external control, reliably executes a necessary and sufficient number of times of refresh operations even when an access request from the outside is frequently generated, and holds data of a volatile memory cell.

A first semiconductor memory device according to the present invention is a semiconductor memory device, which includes a memory cell array, word lines, bit lines and the like, and includes: a clock oscillator for generating an oscillation clock; a first signal generation circuit for generating, based on the oscillation clock, a refresh request signal; a second signal generation circuit for generating, in response to an access request signal from the outside, a start time detection signal indicating a refresh start possible zone; and a third signal generation circuit for generating, based on the refresh request signal and the start time detection signal, a refresh internal row control signal for performing an internal refresh operation.

Thus, the internal refresh start possible zone can be set and internal refresh can be automatically performed. Therefore, complicated external refresh control can be made unnecessary.

If the third signal generation circuit generates the refresh internal row control signal after a lapse of a delay time made by the delay circuit, for example, even in the case where the semiconductor memory device is in a pre-charge operation while a refresh signal is generated, the start of a refresh operation can be delayed by the delay circuit so that a refresh operation is started after the pre-charge operation is completed. Accordingly, an error operation due to a conflict between timings of internal operation can be avoided.

If the first semiconductor memory device further includes a fourth signal generation circuit for generating a refresh enable signal, based on a count value for the number of times of refresh execution, and in the first semiconductor memory device, in response to the refresh enable signal, the first signal generation circuit generates the refresh request signal if the refresh enable signal is a first logic level, and does not generate the refresh request signal if the refresh enable signal is a second logic level, the number of times of internal refresh execution in an internal refresh period can be limited to a necessary number for holding data of a memory cell. Therefore, a current during internal refresh can be reduced.

It is preferable to monitor an error flag to check whether internal refresh has been executed for a predetermined number of times or whether an error in which internal refresh is not been executed for the predetermined number of times has occurred.

By delaying a read/write of a memory cell from a beginning of a read/write cycle by a time equal to or longer than an internal refresh processing time and then starting the read/write, it is possible to insert internal refresh processing in an interval between a time when a read/write request is accepted and a read/write cycle is started and a time when read/write processing is actually performed. Therefore, it is only required to generate the start time detection signal indicating a refresh start possible zone so that internal refresh is executed during the interval.

If the second signal generation circuit generates the start time detection signal at a timing at which the read/write processing and an internal refresh operation do not overlap with each other, an error operation due to a conflict between an internal refresh operation and a read/write operation can be prevented.

In that case, if the second signal generation circuit activates the start time detection signal when a read/write cycle is completed, and deactivates, after a lapse of a predetermined delay time, the start time detection signal when a subsequent read/write cycle is started, a relationship between the predetermined delay time and a delay time until a read write cycle is actually started can be appropriately set. Therefore, the start time detection signal can be generated in a simple manner so that read/write processing and an internal refresh operation do not overlap with each other.

With a refresh halt signal from the outside received as an input, internal refresh is stopped when the refresh halt signal is an active level, so that it is possible to stop internal refresh in response to the refresh halt signal from the outside if internal refresh is not necessary. Therefore, current reduction becomes possible.

At a test, if refresh is performed according to a test refresh command from the outside, detailed refresh evaluation such as frequency characteristics evaluation of a refresh operation can be preformed.

Moreover, at a test, if the refresh halt signal is made an active level, internal refresh is stopped, and refresh is performed according to a test refresh command from the outside, it is possible to stop internal refresh and perform a refresh test during refresh according to the command from the outside in the test.

The first semiconductor memory device generates an internal row control reset signal for stopping an internal refresh operation after a lapse of a predetermined delay time from activation of the refresh internal row control signal made by a delay circuit, so that an internal refresh operation period can be set to be an optimum value internally in the semiconductor memory device.

If when starting internal refresh in response to an internal refresh request, the refresh control circuit starts internal refresh after a lapse of a given time after an internal row address is switched from an external address to a refresh address, the internal row address can be determined before the start of an internal refresh operation and data destruction due to multiple selection of word lines can be prevented.

If based on the row control signal input, the first semiconductor memory device activates a word line to read out data of a memory cell, generates a read/write row control signal, deactivates the read/write internal row control signal after a lapse of a first predetermined delay time from activation of a transfer gate enable signal if a column control signal is active, and deactivates the read/write internal row control signal after a lapse of a second predetermined delay time from activation of the read/write internal row control signal if the column control signal is not active, operation times of a word line, a sense amplifier and the like can be optimized.

It is preferable that when the column control signal is not active, the first semiconductor memory device starts amplification of data of a memory cell by the sense amplifier and deactivates the read/write internal row control signal after a lapse of a predetermined time.

A second semiconductor memory device according to the present invention is a semiconductor memory device which includes a memory cell array, word lines, bit lines and the like, and includes a refresh period measurement circuit for measuring an internal refresh period and a counter circuit for counting the number of times of internal refresh execution.

Thus, it is possible to count the number of times of internal refresh execution and then stop the refresh when the number reaches a predetermined number. Therefore, the number of times of refresh execution in a given period can be limited to a necessary number required for holding data of a memory cell, thus resulting in reduction in current during refresh.

In that case, when the internal refresh period is completed, an error flag is output if internal refresh has not executed for a predetermine number of times in the internal refresh period. Then, by monitoring an error output, whether refresh has been executed for the predetermined number of times (a necessary number of times for holding data of a memory cell) can be checked.

A semiconductor integrated circuit device according to the present invention includes the above-described memory and logic sections and is so configured that internal refresh can be performed in the memory section. Thus, the configuration of a logic section in a system LSI or the like can be simplified.

In that case, if in the memory section, an error flag is output if internal refresh has not executed for a predetermine number of times in the internal refresh period, and the logic section reads out, when receiving the error flag, only part of data stored in the memory section which has been written after the error flag is received, an error read-out can be prevented.

With the semiconductor memory device or the semiconductor integrated circuit device of the present invention, a refresh start possible zone can be detected internally in a memory, refresh can be automatically performed. Accordingly, refresh from the outside of a memory can be made unnecessary. Therefore, refresh control in the outside of the memory, e.g., the logic section, which has required many design steps, can be simplified.

DESCRIPTION OF THE PREFERRED EMBODIMENTS (First Embodiment)
—Entire Structure—

Figure 1:
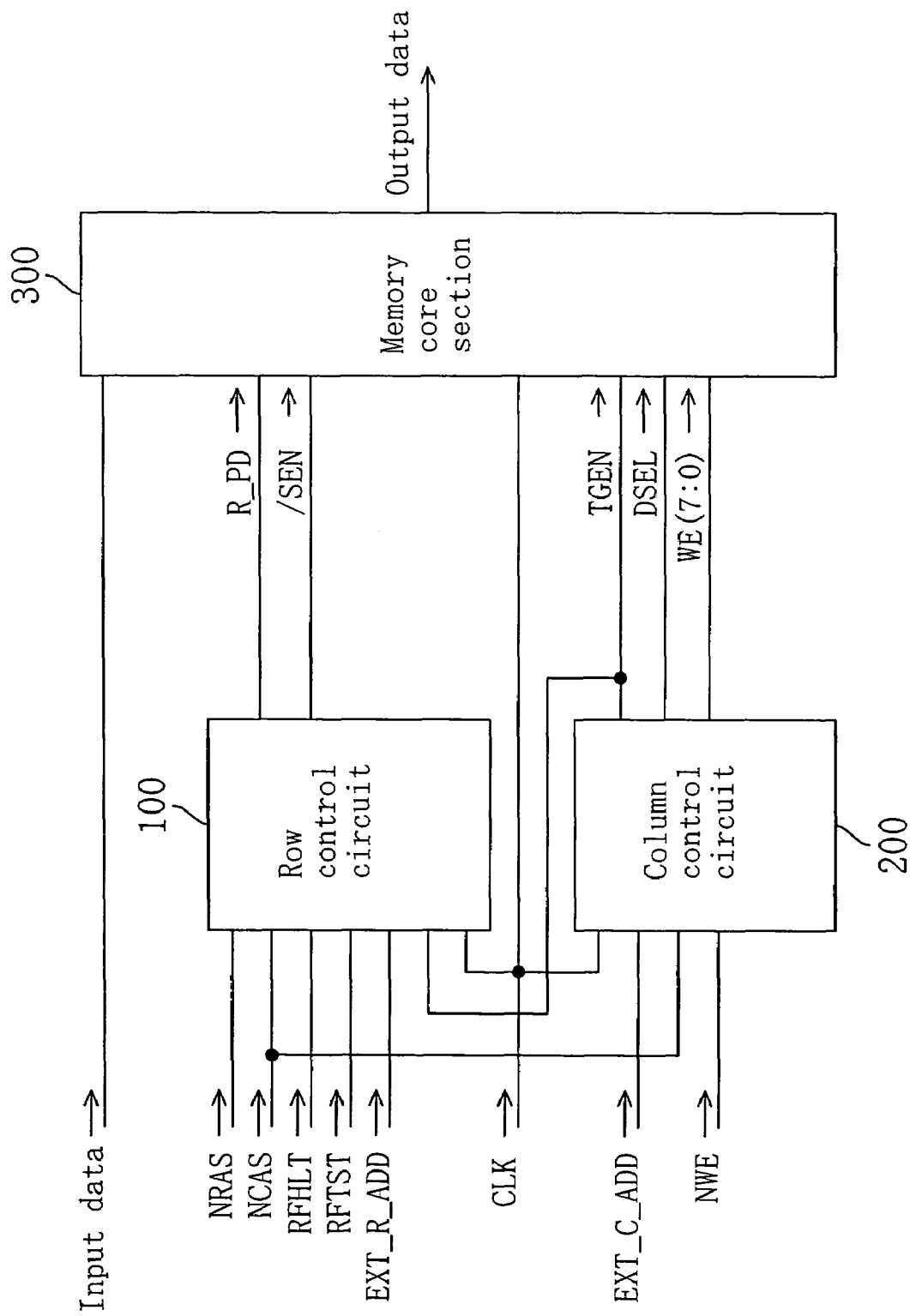
FIG. 1 is a block diagram illustrating a simplified configuration of a semiconductor memory device according to a first embodiment of the present invention.

FIG. 1 is a block diagram illustrating a simplified configuration of a semiconductor memory device according to a first embodiment of the present invention. As shown in FIG. 1, the semiconductor memory device of this embodiment includes a memory core section 300 including a memory cell array formed of memory cells arranged in a matrix, a word line extending along the row direction of the memory cell array, a bit line extending along the column direction of the memory cell array, and a sense amplifier for amplifying a signal read out from the memory cell, a row control circuit 100 for controlling selection/non-selection and the like of the word line, and a column control circuit 200 for controlling selection/non-selection and the like of the bit line.

To the row control circuit 100, a row control signal NRAS, a column control signal NCAS, a refresh halt signal RFHLT, a test refresh signal RFTST, an external row address EXT_R_ADD, and an external clock CLK are input. In the row control circuit 100, a row pre-decoded signal R_PD and a reverse sense amplifier enable signal /SEN are generated and these signals are sent to the memory core section 300.

To the column control circuit 200, the external clock CLK, an external column address EXT_C_ADD and a write enable NWE are input. The column control circuit 200 generates a transfer gate enable signal TGEN, a data selection signal DSEL and a 8 bit write enable signal WE (7:0) and transfers these signals to the memory core section 300 or the row control circuit 100.

To the memory core section 300, in addition to the signals from the row control circuit 100 and the column control circuit 200, the external clock CLK is input.

—The configuration of the row control circuit—

Figure 2:
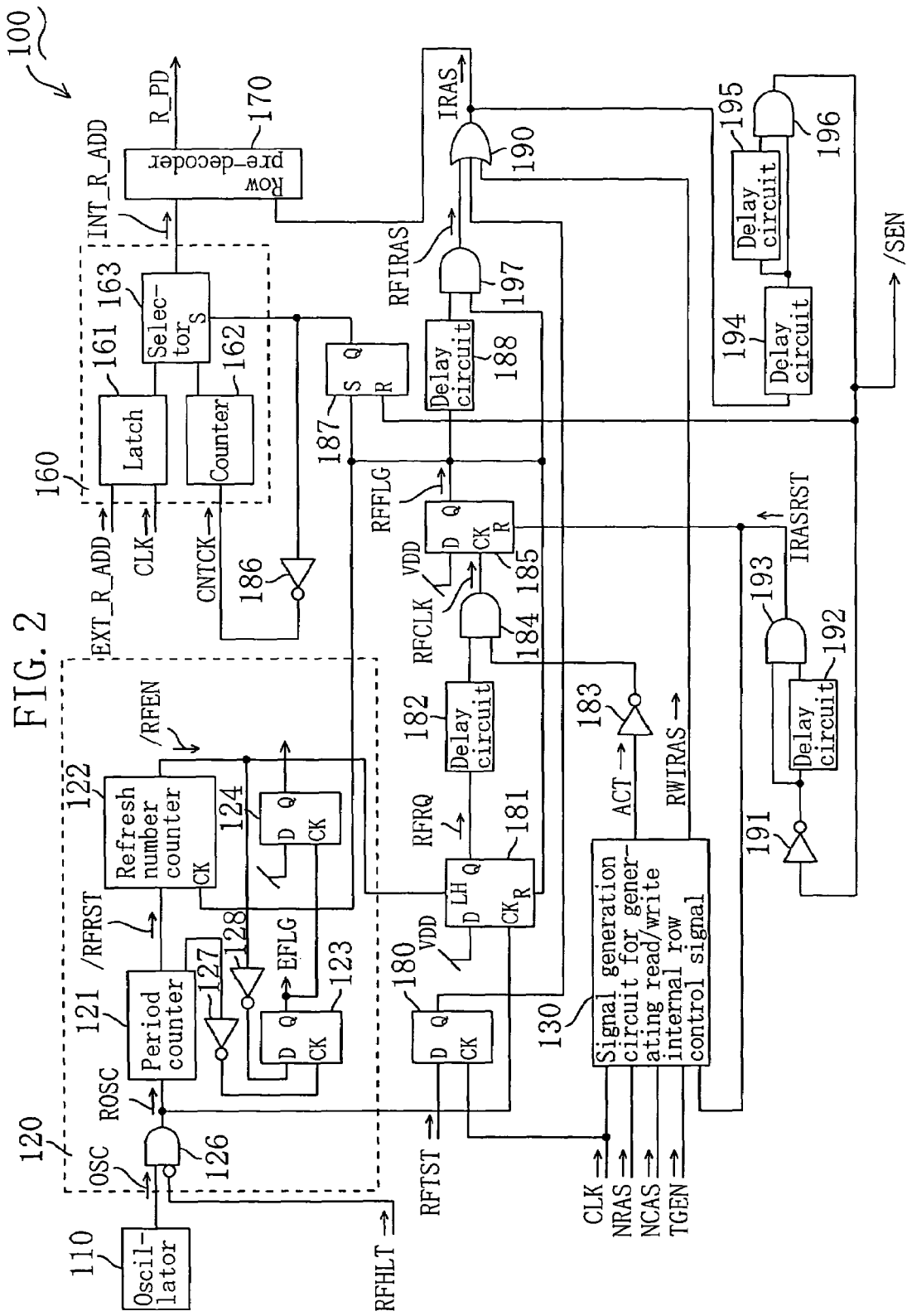
FIG. 2 is a circuit diagram illustrating the configuration of a row control circuit in the semiconductor memory device of the first embodiment.

FIG. 2 is a circuit diagram illustrating the configuration of the row control circuit 100 in the semiconductor memory device of the first embodiment. As shown in FIG. 2, the row control circuit 100 includes a refresh request control circuit 120 for generating an internal refresh request signal RFRQ, a row address generation circuit 160 for generating an internal row address INT_R_ADD, a read/write internal row control signal generation circuit 130 for receiving the external clock CLK, the row control signal NRAS, the column control signal NCAS, the transfer gate enable signal TGEN and an internal row control reset signal IRASRST (which will be described later) and generating an active signal ACT and a read/write internal row control signal RWIRAS, and various other circuit elements.

The refresh request control circuit 120 includes an AND gate 126 for receiving an oscillation clock OSC from an oscillator 110 and a refresh halt signal RFHLT from the outside and generating a reference clock ROSC, a period counter 121 for receiving the reference clock ROSC output from the AND gate and outputting, based on a counter most significant bit CNT_MSB, a reset signal /RFRST, a refresh number counter 122 for counting the number of times of refresh execution and generating a refresh enable signal /RFEN, an inverter 127 for inverting an output of the period counter 121, an inverter 128 for inverting an output of the refresh number counter 122, a D flipflop 123 for receiving outputs of the inverters 128 and 127 at a D terminal and a CK terminal, respectively, and a D flipflop 124 for receiving an output of the D flipflop 123 at a CK terminal.

Figure 3:
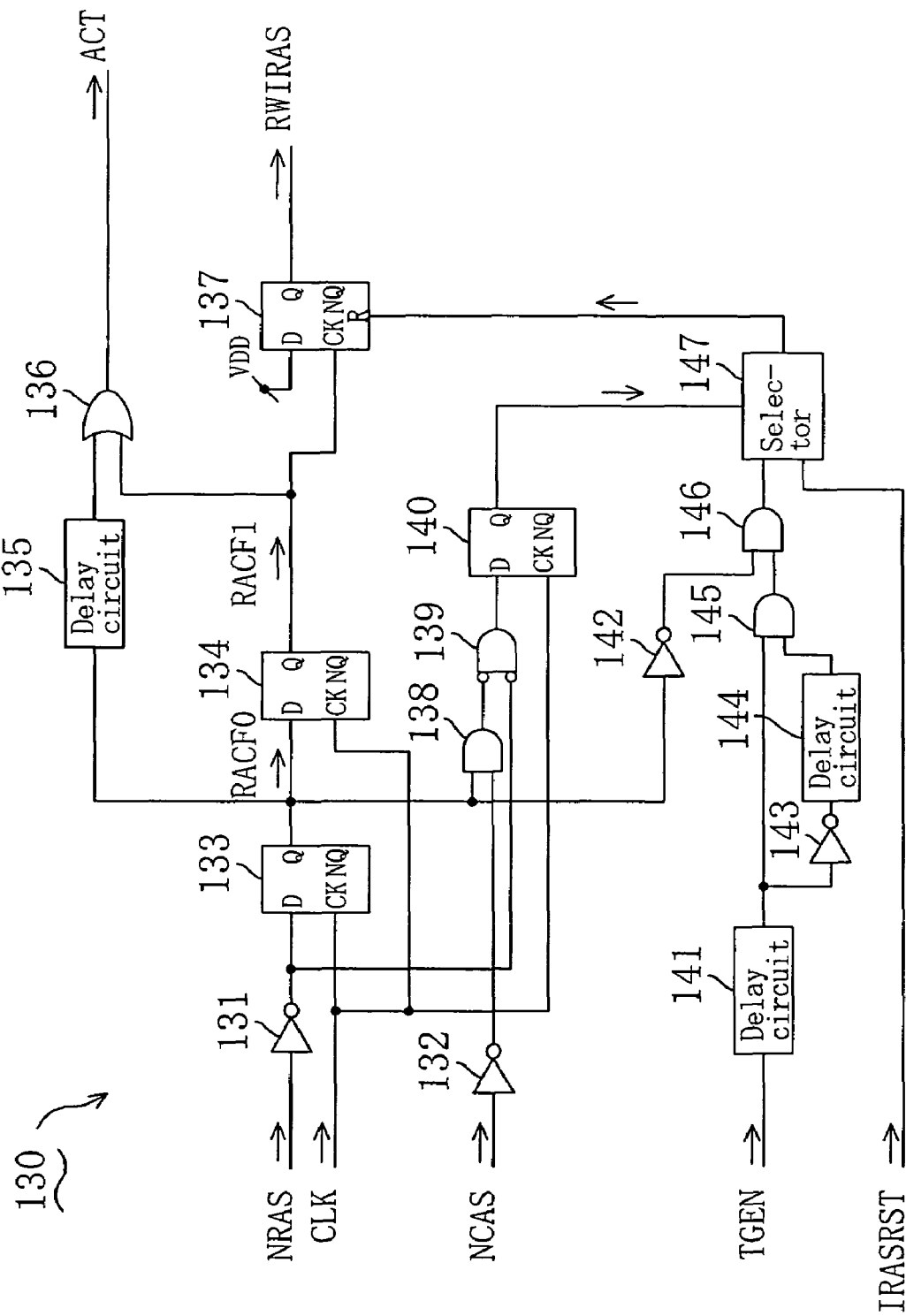
FIG. 3 is a circuit diagram illustrating the configuration of a column control circuit in the semiconductor memory device of the first embodiment.

FIG. 3 is a circuit diagram illustrating the configuration of the read/write internal row control signal generation circuit 130. As shown in FIG. 3, the read/write internal row control signal generation circuit 130 includes an inverter 131 for inverting NRAS, an inverter 132 for inverting NCAS, a D flipflop 133 for receiving an output of the inverter 131 and the external clock CLK at a D terminal and a CK terminal, respectively, and outputting a signal RACF0, a D flipflop 134 for receiving the signal RACF0 and the external clock CLK at a D terminal and a CK terminal, respectively, and outputting a signal RACF1, a delay circuit 135 for delaying the signal RACF0, an OR gate 136 for performing an OR operation for an output of the delay circuit 135 and the signal RACF1 and outputting an active signal ACT, a D flipflop 137 for receiving a supply voltage VDD and the signal RACF1 at a D terminal and a CK terminal, respectively, and outputting a read/write internal row control signal RWIRAS, an AND gate 138 for performing an AND operation for an output of the inverter 132 and the signal RACF0, an AND gate 139 for performing an AND operation for inverted signals of an output of the AND gate 138 and an output of the inverter 131, a D flipflop 140 for receiving an output of the AND gate 139 and the external clock CLK at a D terminal and a CK terminal, respectively, a delay circuit 141 for delaying the transfer gate enable signal TGEN, an inverter 143 for inverting an output of the delay circuit 141, a delay circuit 144 for delaying an output of the inverter 143, an AND gate 145 for performing an AND operation for each of outputs of the delay circuits 141 and 144, an inverter 142 for inverting the signal RACF0, an AND gate 146 for performing an AND operation for an output of the inverter 142 and an output of the AND gate 145, and a selector 147 for selecting an output of the AND gate 146 and the internal row control reset signal IRASRST and sending one of the output of the AND gate 146 and the internal row control reset signal IRASRST to an R terminal of the D flipflop 137.

With the above described configuration, the read/write internal row control signal generation circuit 130 receives the row control signal NRAS (an L active in this embodiment), as an access request signal for requesting an access from the outside, synchronously with the external clock CLK, and then, in response to this, generates the active signal ACT as a start time detection signal indicating a zone in which internal refresh can be started while activating the read/write internal row control signal RWIRAS for internally executing read/write processing. Furthermore, when the column control signal NCAS (the L active in this embodiment) which is subsequently input synchronously with the external clock and controls an column access from the outside is input (i.e., activated), an output of the AND gate 146 is selected by the selector 147 and, after a lapse of a delay time from the transfer gate enable signal TGEN made by the delay circuit 14 and the like, the read/write internal row control signal RWIRAS is deactivated. When the column control signal NCAS is deactivated, the selector 147 selects the internal row control reset signal IRASRST, after a lapse of a delay time from the generation of an internal row control signal IRAS of FIG. 2 made by the delay circuits 194, 195, 192 and the like, the read/write internal row control signal RWIRAS is deactivated.

Note that in this embodiment, as has been described, an active signal ACT is generated in a circuit integrated with the read/write internal row control signal generation circuit. However, the second signal generation circuit for generating a start time detection signal indicating an internal refresh start possible zone is not limited thereto, but various modifications can be made.

Moreover, in the row control circuit 100, a D flipflop 180 for receiving the test refresh signal RFTST from the outside and the external clock CLK at a D terminal and a CK terminal, respectively, a D flipflop 181 for receiving the refresh enable signal /RFEN output from the refresh request control circuit 120 (the refresh number counter 122), the supply voltage VDD, the reference clock ROSC and a refresh flag RFFLG at a control terminal (LH terminal), a D terminal, a CK terminal and an R terminal, respectively, and outputting the refresh request signal RFRQ, a delay circuit 182 for delaying the refresh request signal RFRQ, an inverter 183 for inverting the active signal ACT output from the read/write internal row control signal generation circuit 130, an AND gate 184 for performing an AND operation for an output of the delay circuit 182 and an output of the inverter 183 to generate a refresh clock RFCK, a D flipflop 185 for receiving the supply voltage VDD, the refresh clock RFCK, and the internal row control reset signal IRASRST at a D terminal, a CK terminal and an R terminal, respectively, and outputting a refresh flag RFFLG, a delay circuit 188 for delaying the refresh flag RFFLG output from the D flipflop 185, an AND gate 197 for performing an AND operation for an output of the delay circuit 188 and the refresh flag RFFLG and outputting the refresh internal row control signal RFIRAS, an OR gate 190 for performing an OR operation for an output of the flipflop 180 into which the refresh internal row control signal RFIRAS and the test refresh signal RFTST are input and the read/write internal row control signal RWIRAS and outputting the internal row control signal IRAS, delay circuits 194 and 195 for delaying the internal row control signal IRAS, an AND gate 196 for performing an AND operation for the internal control signal IRAS, which has passed through each of the delay circuits 194 and 195, and outputting the sense amplifier enable signal /SEN, an inverter for inverting the sense amplifier enable signal /SEN, a delay circuit 192 for delaying an output of the inverter 191, an AND gate 193 for an AND operation for an output of the inverter 191 and an output of the delay circuit 192 and outputting the internal row control reset signal IRASRST, a set/reset circuit 187 for receiving the sense amplifier enable signal /SEN and the refresh flag RFFLG at an R terminal and an S terminal, respectively, and an inverter 186 for inverting an output of the set/reset circuit 187 and outputting a count clock CNTCK.

The row address generation circuit 160 includes a latch 161 for latching the external row address EXT_R_ADD synchronously with the external clock CLK, a counter 162 for counting the count clock CNTCK output from the inverter 186, and a selector 163 for receiving an output of the set/reset circuit 187 at an S terminal, selecting one of respective outputs of the latch 161 and the counter 162 and outputting a selected output as an internal row address INT_R_ADD.

Furthermore, in the row control circuit 100, a row pre-decoder 170 for receiving the internal row address INT_R_ADD output from the selector 163 of the row address generation circuit 160 and the internal row control signal IRAS output from the OR gate 190 and generating a row pre-decoded signal R_PD.

In this embodiment, the refresh request signal RFRQ is generated using the period counter 121, the refresh number counter 122 and the like which are shown in FIG. 2. However, the first signal generation circuit for generating a refresh request signal based on an oscillator clock is not limited thereto, but various modifications can be made.

Moreover, in this embodiment, the refresh internal row control signal RFIRAS is generated using the delay circuit 182, the AND gate 184, the D flipflop 185, the delay circuit 188, the AND gate 197 and the like which are shown in FIG. 2. However, the third signal generation circuit for generating a refresh internal row control signal based on a refresh request signal and a start time detection signal indicating a refresh start possible zone is not limited thereto, but various modifications can be made.

Furthermore, in this embodiment, using the period counter 121 (refresh period measurement circuit) and the refresh number counter 122 (signal generation circuit for generating a refresh enable signal) which are shown in FIG. 2, a refresh period is measured and the refresh enable signal /RFEN is generated. However, the refresh period measurement circuit and the signal generation circuit for generating a refresh enable signal are not limited thereto, but various modifications can be made.

Figure 4:
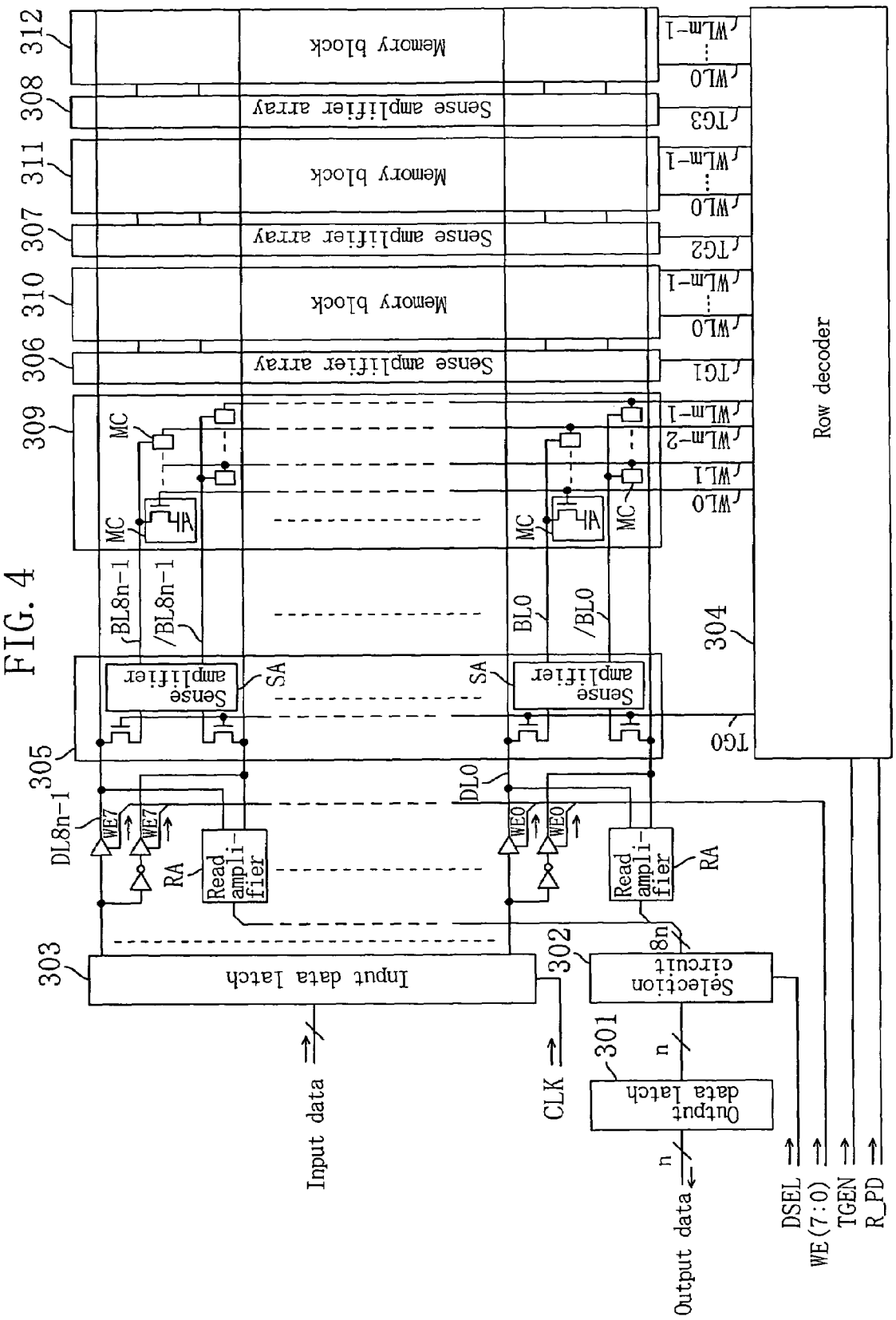
FIG. 4 is a circuit diagram illustrating the configuration of a read/write internal row control signal RWIRAS generation circuit in the semiconductor memory device of the first embodiment.

FIG. 4 is a circuit diagram illustrating a memory core section of the semiconductor memory device (DRAM) of the first embodiment. As shown in FIG. 4, the memory core section 300 includes an output data latch 301 for latching output data, a selection circuit 302 for selecting from which read amplifier RA data is sent to the data latch 301, an input data latch 303 for latching input data, a row decoder 304, and sense amplifier arrays 305, 306, 307 and 308 each including a plurality of sense amplifiers SA arranged therein, memory cell blocks 309, 310, 311 and 312 each including a plurality of memory cells MC arranged in a matrix.

Transfer gate lines TG connected to respective gates of switching transistors of the sense amplifier arrays 305 through 308 and word lines WL connected to respective gates of memory cells MC of the memory blocks 309 through 312 extend from the row decoder 304. Moreover, the sense amplifiers SA are connected to associated ones of the memory cells MC through bit lines BL and /BL. Each of the read amplifiers RA and each of the sense amplifiers SA are connected to each other through a data line DL.

In write-in and read-out operations, the row decoder 304 receives the transfer gate enable signal TGEN and the row pre-decoded signal R_PD and selects one of the word lines WL and one of the transfer gate lines TG. In a write-in operation, input data is sent, synchronously with the external clock CLK, from the input data latch 303 to selected one of the memory cells MC via a three-state buffer which receives the write enable signal WE (7:0) as a control signal and the sense amplifiers SA. In a read-out operation, data of the memory cell MC read out by the read amplifier RA is retrieved from the output data latch 301 via the selection circuit 302 which receives a data selection signal DSEL as a control signal.

—Refresh Operation—

Hereafter, the case where refresh is internally performed in the DRAM during a read/write cycle will be described with reference to a timing chart in FIG. 5, and FIGS. 2 and 3.

First, when an oscillation clock OSC, i.e., an output of the oscillator 110 rises from an L level to a H level between times t1 and t2, the D flipflop 181 is set to be the H level, so that a refresh request signal RFRQ is made an active level (H level), and, after a slight delay, an output of the delay circuit 182 is made the H level. At this time, the DRAM is in a read/write cycle according to a row control signal NRAS which has been input at the time t1. Thus, the active signal ACT, i.e., an output of the OR gate 136 shown in FIG. 3 is made the H level (i.e., a start time detection signal indicating a refresh start possible zone is de-activated) and the fresh clock RFCK, i.e., an output of the AND gate 184 is still at the L level. Therefore, a refresh request is not accepted.

Thereafter, at a time t3, the read/write of a memory cell is completed, a word line (WL) voltage is made the L level and the active signal ACT is made the L level (i.e., a start time detection signal indicating a refresh start possible zone is activated). Accordingly, a refresh request is accepted and a refresh flag RFFLG, i.e., an output of the D flipflop 185 is made the H level. Then, due that the refresh flag RFFLG input into the R terminal of the D flipflop 181 is made the H level, the D flipflop 181 is reset and the refresh request signal RFRQ which has been already accepted is made the L level.

Between the time t3 and the time t4, when the refresh flag RFFLG is made the H level, an output of the set/reset circuit 187 is made the H level. Accordingly, the selector 163 selects an output of the counter 162 and outputs a value of the refresh counter as an internal row address INT_R_ADD. Then, after the refresh flag RFFLG has been delayed by a time which the row pre-decider 170 requires for performing pre-decoding, the internal row control signal IRAS is made the H level by the delay circuit 188 and then a refresh row operation (an operation such as driving of a word line) is started.

Thereafter, when data of a memory cell connected to a selected word line WL is output to bit lines BL and /BL, the sense amplifier enable signal /SEN is made the L level. After the data has been amplified by a sense amplifier and delayed by a time necessary for re-write of the memory cell in the delay circuit 192, the internal row control signal IRAS is made the L level and the refresh operation is stopped. Then, at the time t4, the refresh is completed and the read/write internal row control signal RWIRAS is made the H level and a write operation is started.

—Operation of Internal Refresh—

Figure 6:
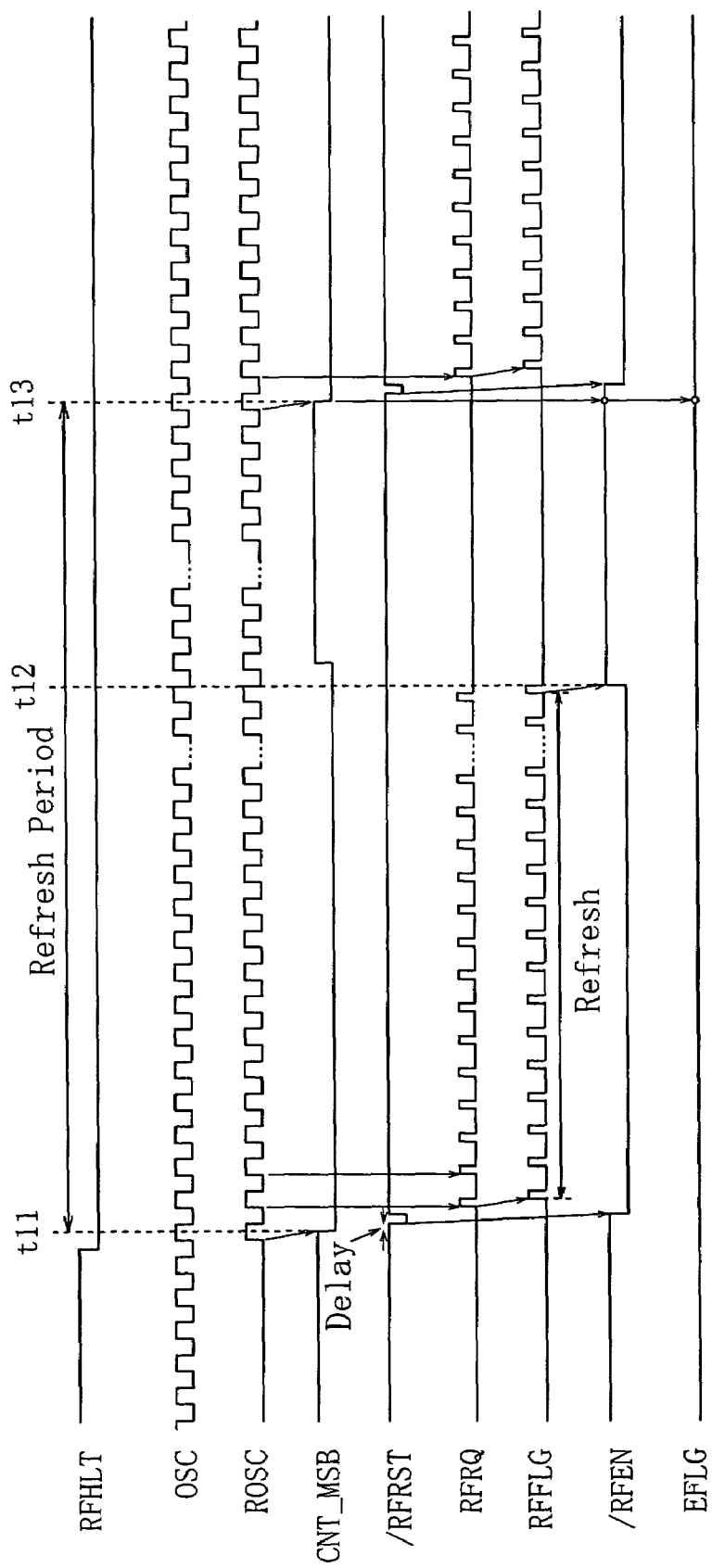
FIG. 6 is a timing chart illustrating an entire operation of internal refresh of the semiconductor memory device of the first embodiment.

Next, the entire operation of internal refresh will be described with reference to a timing chart shown in FIG. 6.

At a time t11, i.e., a beginning of a refresh period, a count of a refresh period is started by the period counter 121 according to the reference clock ROSC and, at the same time, the refresh number counter 122 is reset. When the refresh number counter 122 is reset, the refresh enable signal /RFEN is made the L level (active level). When the refresh enable signal /RFEN is made the L level, an output of the D flipflop 181 is made the H level at a rise of the reference clock ROSC. Thus, the refresh request signal RFRQ is made an active level and each of the refresh flag RFFLG and the internal row control signal IRAS is made the H level, so that a refresh operation is repeatedly performed. In this manner, only when the refresh request signal RFRQ is made the active level in response to a fall of the reference clock ROSC, a refresh operation is performed. Then, when the number of times of refresh execution is counted at a rise of the refresh flag RFFLG by the refresh number counter 122 and the number of times of refresh execution reaches m (time(s) for which refresh is required to be performed) at a time t12, the refresh enable signal /REFN is made the H level (non-active level) by the refresh number counter 122, so that a refresh request operation is stopped. Thereafter, when a refresh period is counted by the period counter at a time t13, the same operation from the time t11 is repeatedly performed.

Note that in the description above, as shown in FIG. 2, the refresh number counter 122 is reset every time when a given period is counted by the period counter 121. However, if a configuration is used in which with a counter for counting a predetermined number of times of refresh execution in a given period provided, when the counter indicates the predetermined number for a count value, the refresh number counter 122 is reset and another count for the number of times of refresh execution is started, the same effects of this embodiment can be obtained.

With the semiconductor memory device of this embodiment, the following effects can be achieved.

Figure 5:
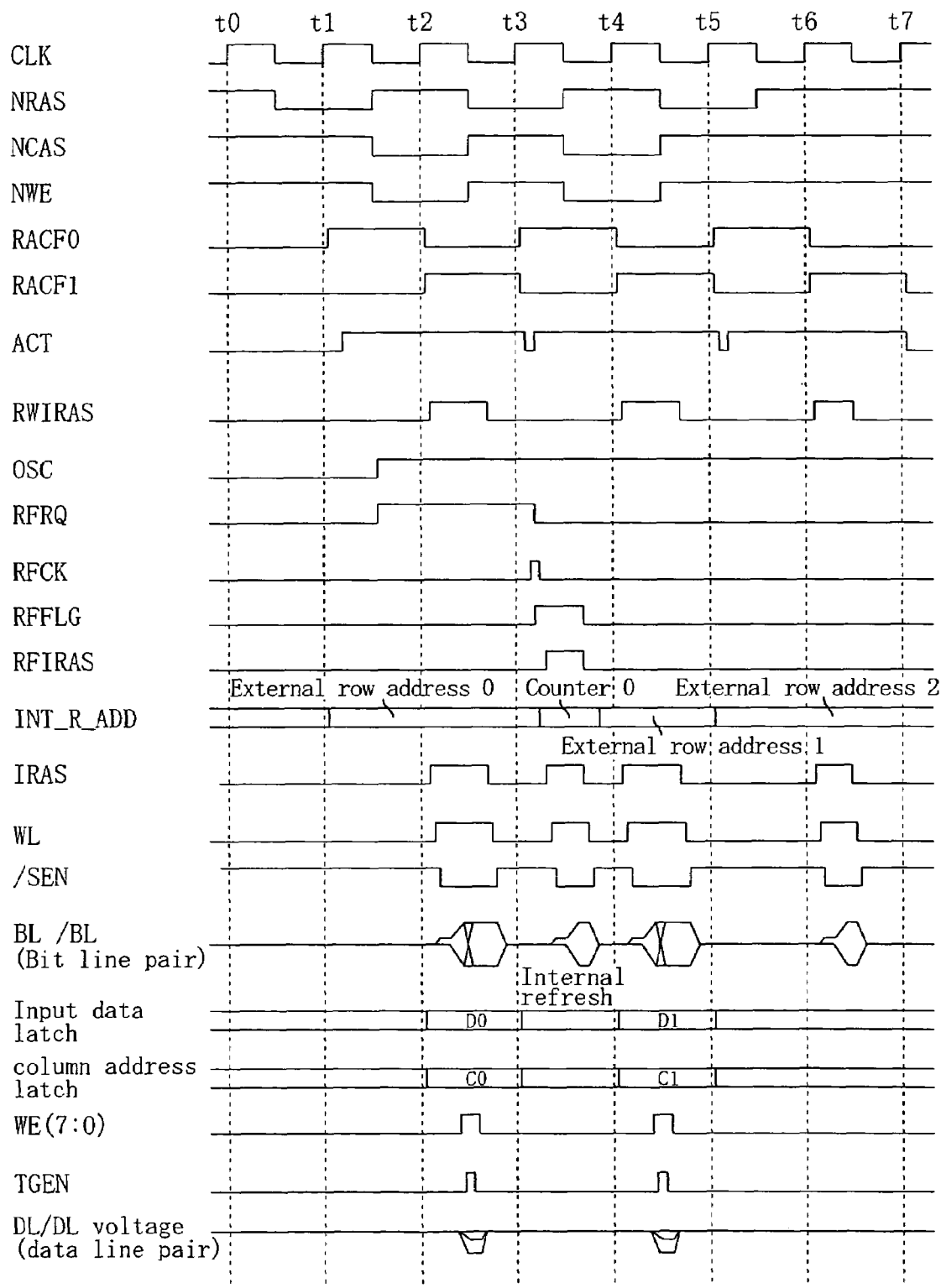
FIG. 5 is a timing chart illustrating an internal refresh operation and the like during a read/write of the semiconductor memory device of the first embodiment.

First, in the DRAM, as shown in FIG. 5, between the times t3 through t4, a refresh start possible zone can be detected using the active signal ACT and refresh can be automatically performed. Accordingly, a refresh command from the outside of the memory can be made unnecessary and a refresh control from the outside of the memory, which has been required a large number of design steps, can be made substantially unnecessary. Therefore, an entire control operation for refresh can be simplified.

Moreover, the semiconductor memory device of this embodiment includes the period counter 121 for measuring an internal refresh period (refresh interval). In the semiconductor memory device, as shown in the timing chart of FIG. 6, the refresh number counter 122 makes the refresh enable signal /REFN a first logic level (L level) at a beginning of each internal refresh period, starts a count of the number of times of internal refresh execution, and makes the refresh enable signal /RFEN a second logic level (H level) when the number of times of internal refresh execution reaches a predetermined number. Then, the refresh request signal RFRQ is generated by the D flipflop 181 when the refresh enable signal /RFEN is the L level and the refresh request signal RFRQ is not generated when the refresh enable signal /RFEN is the H level. Accordingly, the number of times of internal refresh execution in an internal refresh period can be limited to a number required for holding data of a memory cell. Therefore, a current during an internal refresh operation can be reduced.

Moreover, whether internal refresh has been executed for a predetermined number of times in a previous refresh period is checked by the D flipflop 123 at a beginning of each internal refresh period. If internal refresh has not been executed for the predetermined number of times, an error flag EFLG is output. Thus, whether refresh has been executed for the predetermined number of times can be checked.

Moreover, at a beginning of each internal refresh, if there is any internal refresh period which has been previously performed and in which internal refresh has not been executed for the predetermined number of times, the D flipflop 123 sets the error flag EFLG to be an error state and holds the error state. Thus, whether an error in which refresh is not executed for a predetermined number of times has occurred can be checked by monitoring the error flag EFLG.

Moreover, the D flipflops 133 and 134 delay the read/write internal row control signal RWIRAS for executing read/write processing for a memory cell so that read/write processing for a memory cell is performed with a delay from a beginning of a read/write cycle by a time longer than a processing time for one internal refresh. Thus, it is possible to insert internal refresh processing within a period between a time when a read/write request is accepted and a read/write cycle is started and a time when read/write processing is actually performed. Therefore, it is only required to generate the active signal ATC as a start time detection signal indicating a refresh start possible zone during this period.

As shown in FIG. 2, with the refresh halt signal RFHLT from the outside received as an input, internal refresh is stopped when the refresh halt signal RFHLT is an active level. Thus, when internal refresh is not required to be performed, internal refresh can be stopped in response to the refresh halt signal RFHLT from the outside. Therefore, a current can be reduced.

Moreover, although not shown in FIG. 5, at a test, refresh is performed according to the test refresh signal RFTST form the outside. Thus, detailed refresh evaluation such as frequency characteristics evaluation of a refresh operation can be preformed.

Moreover, although not shown in FIG. 5, at a test, the refresh halt signal RFHLT is made an active level to stop internal refresh, thereby performing refresh according to the test refresh signal RFTST from the outside. Thus, it is possible to stop internal refresh and perform a refresh test during refresh according to an external command in the test.

The refresh control circuit can set an internal refresh operation period to be an optimum value internally in the semiconductor memory device with the delay circuits 194, 195, and 192 serving as delay circuits for delaying the internal row control reset signal IRASRST so that the internal row control reset signal IRASRST is output after a lapse of a predetermined time from a start of internal refresh.

Moreover, after the refresh flag RFFLG has been delayed, the internal row control signal IRAS is made the H level by the delay circuit 188. Thus, at the start of an internal refresh operation, selection of a row address by the selector 163 can be reliably completed before a refresh operation is started. Accordingly, destruction of data of memory cell due to selecting multiple word lines can be prevented.

The read write internal row control signal RWIRAS is generated based on the row control signal NRAS input from the outside synchronously with the external clock CLK. Subsequently, if the column control signal NCAS input from the outside synchronously with the external clock CLK is active, the read/write internal row control signal RWIRAS is deactivated after a delay time from activation of the transfer gate enable signal TGEN made by the delay circuit 141 and the like. If the column control signal NCAS is not activate, the read/write internal row control signal RWIRAS is deactivated after a delay time from activation of the read/write internal row control signal RWIRAS made by the delay circuits 194, 195 and 192 and the like. Thus, an operation time for row access control for driving a word line and performing amplification by a sense amplifier can be optimized.

(Second Embodiment)

Figure 7:
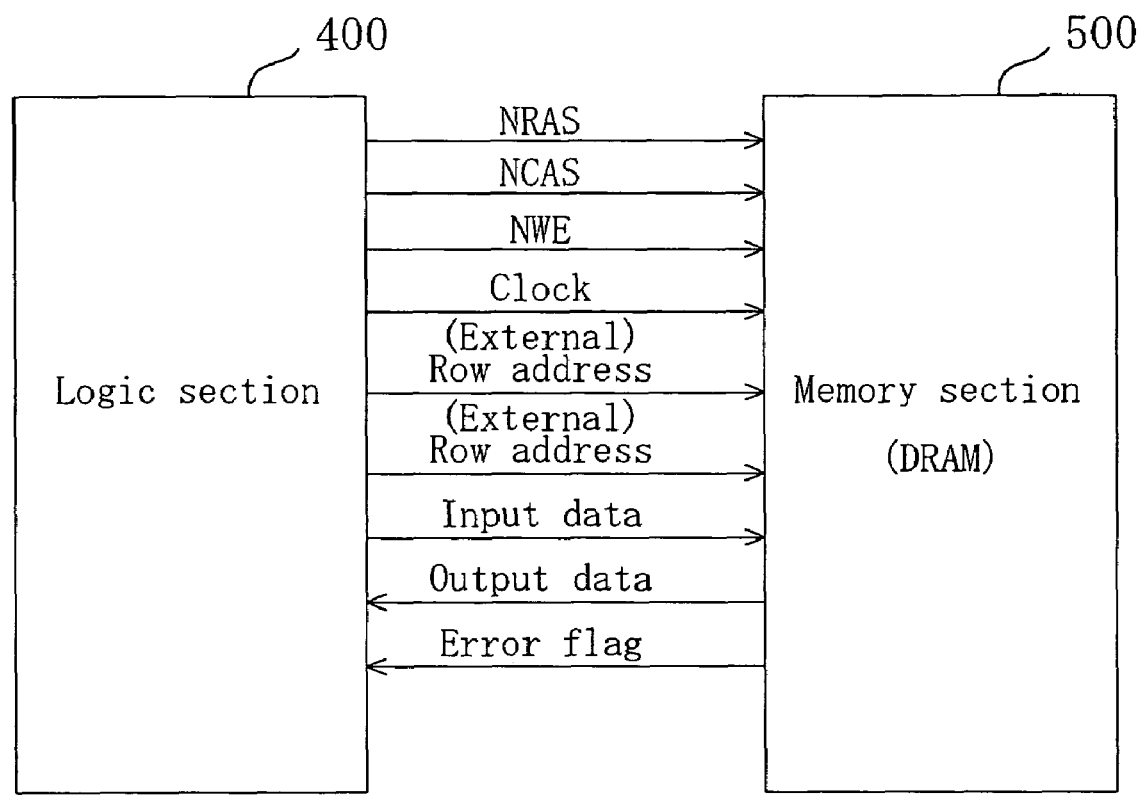
FIG. 7 is a diagram schematically illustrating the configuration of a semiconductor integrated circuit device according to a second embodiment of the present invention.

FIG. 7 is a diagram schematically illustrating the configuration of a semiconductor integrated circuit device according to a second embodiment of the present invention. As shown in FIG. 7, the semiconductor integrated circuit device of this embodiment includes a logic section 400 including a CMOS device having a CPU and various other operational circuits and a memory section (DRAM) 500, i.e., the semiconductor memory device of FIG. 1. In the semiconductor integrated circuit device of FIG. 6, the memory section 500 has the same configuration as that shown in FIGS. 1 through 4 described in the first embodiment. In the logic section 400, the CPU and many operational circuits are arranged.

Then, a row control signal NRAS, a column control signal NCAS, a write enable NWE, an external row address EXT_R_ADD, an external column address EXT_C_ADD, an input data, and the like are sent from the logic section 400 to the memory section 500. As described in the first embodiment, these signals are sent to row control circuit and column control circuit of the memory section 500. Moreover, from the memory section 500 to the logic section 400, output data and an error flag are sent.

In this embodiment, when the logic section 400 receives an error flag (see the time t13 in FIG. 6), after the error flag has been received, the logic section 400 sends a command to re-write data in the memory section 500. Specifically, for example, with NRAS=L, NCSA=L and NEW=L, new input data is written in the memory section 500.

Then, after the error flag is received in the logic section 400, data which has been written by the time when the error flag is received is not read out and only data which has been written in the memory section 500 after the error flag is received in the logic section 400 is read out.

As has been described in the first embodiment, in the semiconductor integrated circuit device of this embodiment, the memory section (DRAM) 500 has the function of generating a refresh clock, so that the semiconductor integrated circuit can detect the refresh start possible zone using the active signal ACT and automatically perform refresh. Accordingly, a refresh command from the logic section 400 becomes unnecessary. Therefore, in a semiconductor integrated circuit device in which a logic and a memory are combined, refresh control in the logic section 400, which has required many design steps, becomes substantially unnecessary. Thus, control of the configuration of the logic section 400 can be simplified.

Moreover, with the semiconductor integrated circuit device of this embodiment and the semiconductor memory device of the first embodiment, even if an access request from the logic section 400 (the outside of a memory) is often given, a necessary and sufficient number of times of refresh operations can be reliably executed in the memory section 500. Specifically, when an error flag is received from the memory section 500 in the logic section 400, a read-out error can be prevented by reading out only data which has been written in the memory section 500 after receiving the error flag.

—Special Effects of the Invention—

Figure 8:
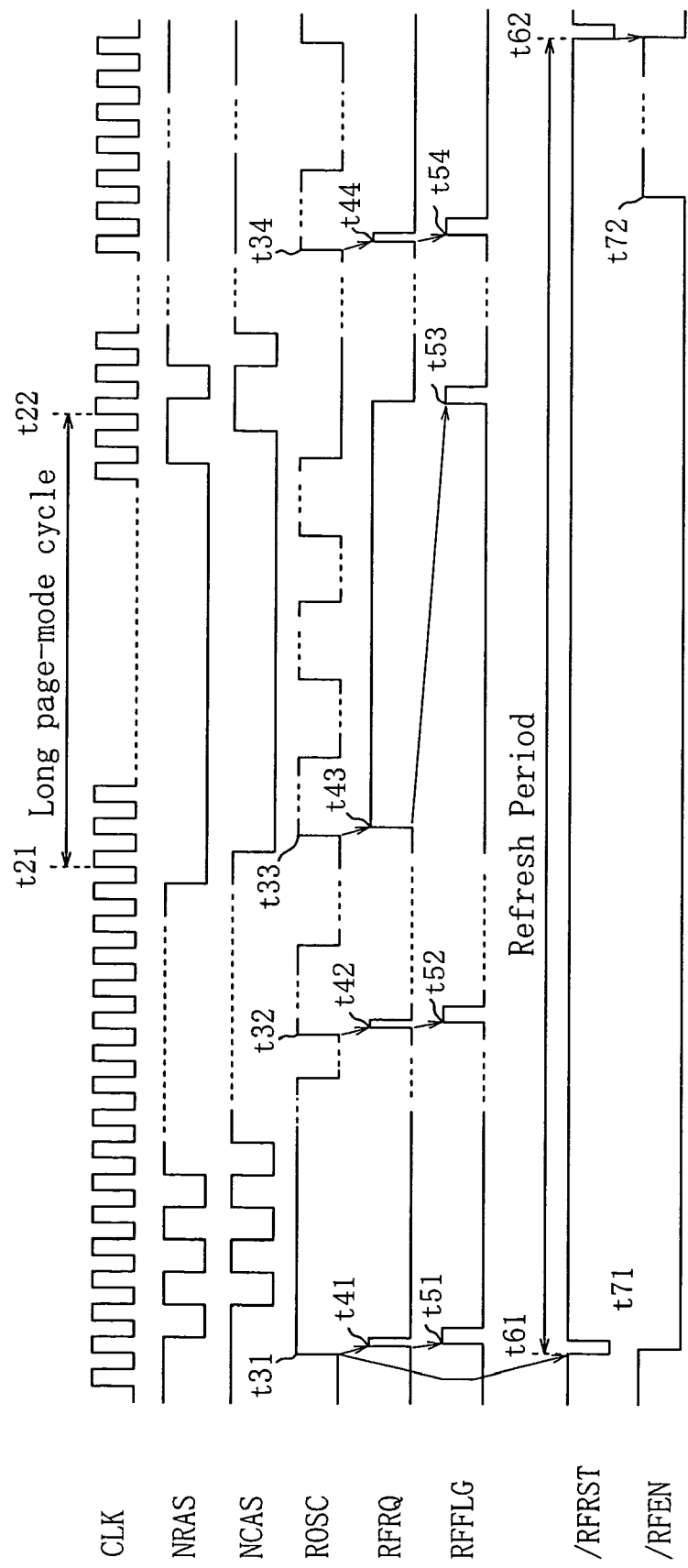
FIG. 8 is a timing chart illustrating an example of a refresh control in the case where a long-page mode cycle is present in a memory section in the present invention.

FIG. 8 is a timing chart illustrating an example of refresh control in the case where a long-page mode cycle is present in a memory section in the present invention. As shown in FIG. 8, in a long-page mode cycle (from a time t21 through a time t22), a refresh request is not accepted, and thus refresh can not be performed during the long-page mode cycle. In this example, a refresh request is accepted only at rise times t31, t32, t33 and t34 of the reference clock ROSC, except for a period in which the reference clock ROSC is in a long-page mode cycle. In response to the request, the refresh request signal RFRQ is made an active level (at times t41, t42, t43 and t44) and the refresh flag RFFLG is made the H level (at times t51, t52, t53 and t54), so that refresh is intensively performed. Specifically, when the refresh enable signal /RFEN is made the L level (active level) at a beginning of an internal refresh period (a time t71), a count of the number of times of internal refresh execution is started and the number of times of internal refresh execution reaches a predetermined number, the refresh enable signal /RFEN is made the H level (non-active level) (at a time t72), so that the refresh request operation is stopped.

In this manner, except for the long-page mode cycle of a refresh period, timings at which a refresh request is accepted are according to intervals of pulses of ROSC. Thus, on average, a necessary number of times of refresh requests are accepted in the refresh period.

In contrast, in the configuration in which a refresh request is given with regular intervals and refresh is performed in response to the request (so-called "dispersed type refresh"), if a refresh request is not accepted in a long-page mode cycle, it may not be possible to perform a necessary number of times of refresh.

According to the present invention, the refresh enable signal /RFEN is made to be an active level at a beginning of each internal refresh period (at the time t71) by the period counter 121, i.e., a refresh period measurement circuit for measuring an internal refresh period, a count of the number of times of internal refresh execution is started and the number of times of internal refresh execution reaches a predetermined number, the refresh enable signal /RFEN is made the H level (non active level) to stop the refresh request operation. With this configuration, even if there is a period in which a refresh request is not accepted (e.g., a long-page mode cycle), refresh can be intensively performed in a short interval in some other period (so-called "intensive type refresh"). Therefore, it can be advantageously ensured to perform necessary refresh.

What is claimed is:

1. A semiconductor memory device so configured that by a memory cell array in which a plurality of memory cells each including a capacitor and a transistor are arranged in a matrix, a plurality of word lines connected to ones of the plurality of memory cells arranged in the row direction of the memory cell array, a plurality of bit lines connected to ones of the plurality of memory cells arranged in the column direction of the memory cell array, and a signal from the outside, a read/write can be performed to the plurality of memory cells, the device comprising:
a clock oscillator for generating an oscillation clock;
a first signal generation circuit for generating, based on the oscillation clock, a refresh request signal;
a second signal generation circuit for generating, in response to an access request signal from the outside, a start time detection signal indicating a refresh start possible zone; and
a third signal generation circuit for generating, based on the refresh request signal and the start time detection signal, a refresh internal row control signal for performing an internal refresh operation.

2. The semiconductor memory device of claim 1, wherein the third signal generation circuit includes a delay circuit for delaying the refresh request signal and generates the refresh internal row control signal after a lapse of a delay time made by the delay circuit.

3. The semiconductor memory device of claim 1, further comprising:
a fourth signal generation circuit for generating a refresh enable signal, based on a count value for the number of times of refresh execution,
wherein in response to the refresh enable signal, the first signal generation circuit generates the refresh request signal if the refresh enable signal is at a first logic level, and does not generate the refresh request signal if the refresh enable signal is at a second logic level.

4. The semiconductor memory device of claim 3, further comprising:
a refresh period measurement circuit for measuring an internal refresh period,
wherein the fourth signal generation circuit makes the refresh enable signal the first logic level at a beginning of each internal refresh period, starts a count of the number of times of internal refresh execution, and, when the number of times of internal refresh execution reaches a predetermined number, makes the refresh enable signal the second logic level.

5. The semiconductor memory device of claim 4, further comprising an error flag output circuit for checking at a beginning of each internal refresh period whether internal refresh has been executed for a predetermined number of times in a previous internal refresh period and outputting, if the internal refresh has not been executed for a predetermined number of times, an error flag.

6. The semiconductor memory device of claim 5, wherein at a beginning of each internal refresh period, if there is any internal refresh period which has been previously performed and in which internal refresh has not been executed for the predetermined number of times, the error flag output circuit sets the error flag to be an error state and holds the error state.

7. The semiconductor memory device of claim 1, further comprising a read/write timing control circuit for delaying a read/write to be performed to the memory cells from a beginning of a read/write cycle by a time equal to or longer than an internal refresh processing time and then starting the read/write.

8. The semiconductor memory device of claim 7, wherein the second signal generation circuit generates the start time detection signal at a timing at which the read/write processing and an internal refresh operation to be performed based on the start time detection signal do not overlap with each other.

9. The semiconductor memory device of claim 8, wherein the second signal generation circuit activates the start time detection signal when a read/write cycle is completed and deactivates, after a lapse of a predetermined delay time, the start time detection signal when a subsequent read/write cycle is started.

10. The semiconductor memory device of claim 1, wherein with a refresh halt signal from the outside received as an input, internal refresh is stopped when the refresh halt signal is at an active level.

11. The semiconductor memory device of claim 1, wherein at a test, refresh is performed according to a test refresh command from the outside.

12. The semiconductor memory device of claim 11, wherein at a test, the refresh halt signal is made at an active level, internal refresh is stopped, and refresh is performed according to a test refresh command from the outside.

13. The semiconductor memory device of claim 1, wherein an internal row control reset signal for stopping an internal refresh operation is generated after a lapse of a predetermined delay time from activation of the refresh internal row control signal made by a delay circuit.

14. The semiconductor memory device of claim 1, wherein when starting internal refresh in response to the refresh request signal, the internal refresh is started after a lapse of a given time after an internal row address is switched from an external address to a refresh address.

15. The semiconductor memory device of claim 1, wherein based on a row control signal input from the outside synchronously with an external clock, one of the word lines is activated to read out data of one of the memory cells, a read/write internal row control signal for controlling the operation of amplifying by a sense amplifier is generated, the read/write internal row control signal is deactivated after a lapse of a first predetermined delay time from activation of a transfer gate enable signal for transferring data of the sense amplifier to a data line if a column control signal supplied from the outside subsequently to supply of the row control signal and synchronously with the external clock is active, and the read/write internal row control signal is deactivated after a lapse of a second predetermined delay time from activation of the read/write internal row control signal if the column control signal is not active.

16. The semiconductor memory device of claim 15, wherein when the column control signal is not active, the read/write internal row control signal is deactivated after a lapse of a predetermined time since a start of amplification of data the memory cells by the sense amplifier.

17. A semiconductor memory device so configured that by a memory cell array in which a plurality of memory cells each including a capacitor and a transistor are arranged in a matrix, a plurality of word lines connected to ones of the plurality of memory cells arranged in the row direction of the memory cell array, a plurality of bit lines connected to ones of the plurality of memory cells arranged in the column direction of the memory cell array, and a signal from the outside, a read/write can be performed to the plurality of memory cells, the device comprising
a clock oscillator for generating an oscillation clock;
a refresh period measurement circuit for measuring an internal refresh period in response to the oscillation clock; and
a counter circuit for counting the number of times internal refresh operations are executed,
wherein the internal refresh operations are executed based on a refresh request signal generated in response to the oscillation clock.

18. The semiconductor memory device of claim 17, wherein the refresh circuit stops refresh from a time when a counter value of the counter circuit becomes a maximum value to a time when an internal refresh period is completed.

19. A semiconductor memory device so configured that by a memory cell array in which a plurality of memory cells each including a capacitor and a transistor are arranged in a matrix, a plurality of word lines connected to ones of the plurality of memory cells arranged in the row direction of the memory cell array, a plurality of bit lines connected to ones of the plurality of memory cells arranged in the column direction of the memory cell array, and a signal from the outside, a read/write can be performed to the plurality of memory cells, the device comprising a refresh circuit which comprises a refresh period measurement circuit for measuring an internal refresh period and a counter circuit for counting the number of times of internal refresh execution,
wherein if internal refresh has not been executed for a predetermined number of times in an internal refresh period when the internal refresh period is completed, the refresh circuit outputs an error flag in response to an output of the counter circuit.

20. A semiconductor integrated circuit device including a memory section and a logic section,
wherein the memory section comprises
a memory cell array in which a plurality of memory cells each including a capacitor and a transistor are arranged in a matrix,
a plurality of word lines connected to ones of the plurality of memory cells arranged in the row direction of the memory cell array,
a plurality of bit lines connected to ones of the plurality of memory cells arranged in the column direction of the memory cell array,
a clock oscillator for generating an oscillation clock,
a first signal generation circuit for generating, based on the oscillation clock, a refresh request signal,
a second signal generation circuit for generating, in response to an access request signal from the outside, a start time detection signal indicating a refresh start possible zone, and
a third signal generation circuit for generating, based on the refresh request signal and the start time detection signal, a refresh internal row control signal for performing an internal refresh operation, and
wherein the logic section has the function of giving a command of a read/write for the memory cells.

21. The semiconductor integrated circuit device of claim 20,
wherein the memory section further comprises a fourth signal generation circuit for generating a refresh enable signal, based on a count value for the number of times of refresh execution, and
wherein in response to the refresh enable signal, the first signal generation circuit generates the refresh request signal if the refresh enable signal is at a first logic level, and does not generate the refresh request signal if the refresh enable signal is at a second logic level.

22. The semiconductor integrated circuit device of claim 21,
wherein the memory section further comprises a refresh period measurement circuit for measuring an internal refresh period, and
wherein the fourth signal generation circuit makes the refresh enable signal at the first logic level at a beginning of each internal refresh period, starts a count of the number of times of internal refresh execution, and, when the number of times of internal refresh execution reaches a predetermined number, makes the refresh enable signal at a second logic level.

23. The semiconductor integrated circuit device of claim 20,
wherein the memory section further comprises
a counter circuit for counting the number of times of internal refresh execution, and
an error flag output circuit for outputting an error flag in response to an output of the counter circuit, if the internal refresh operation has not been executed for a predetermined number of times, at a time when an internal refresh period is completed, and
wherein the logic section controls the memory section so that only part of data stored in the memory section, which has been written in the memory section since the error flag has been received, is read out.

* * * * *